US008788992B2

(12) United States Patent
Liu

(10) Patent No.: US 8,788,992 B2
(45) Date of Patent: Jul. 22, 2014

(54) CIRCUIT DESIGN SUPPORT METHOD, CIRCUIT DESIGN SUPPORT APPARATUS, AND COMPUTER PRODUCT

(71) Applicant: Fujitsu Limited, Kawasaki (JP)

(72) Inventor: Yu Liu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/066,240

(22) Filed: Oct. 29, 2013

(65) Prior Publication Data

US 2014/0173540 A1   Jun. 19, 2014

(51) Int. Cl.
*G06F 9/455* (2006.01)
*G06F 17/50* (2006.01)

(52) U.S. Cl.
USPC ........... 716/106; 716/107; 716/108; 716/111; 716/113

(58) Field of Classification Search
CPC ........... G06F 17/5031; G06F 17/5068; G06F 17/5036; G06F 2217/84; G06F 17/5077; G06F 17/5072; G06F 2217/78; H01L 21/7684
USPC .......................... 716/106, 108, 107, 111, 113
See application file for complete search history.

(56) References Cited

U.S. PATENT DOCUMENTS

| 6,981,238 | B1 * | 12/2005 | Churchill ....................... 716/115 |
| 7,418,683 | B1 * | 8/2008 | Sonnard et al. ............... 716/122 |
| 8,150,638 | B1 * | 4/2012 | Wu et al. ......................... 702/57 |
| 8,209,650 | B2 * | 6/2012 | St. John et al. ................ 716/111 |
| 2006/0123377 | A1 * | 6/2006 | Schultz et al. .................. 716/11 |
| 2006/0136860 | A1 * | 6/2006 | Boshart et al. ................... 716/18 |
| 2007/0079269 | A1 * | 4/2007 | Corbeil et al. .................... 716/5 |
| 2007/0101302 | A1 | 5/2007 | Okamoto |
| 2008/0120586 | A1 * | 5/2008 | Hoerold ............................ 716/9 |

(Continued)

FOREIGN PATENT DOCUMENTS

| JP | 2004-145410 | 5/2004 |
| JP | 2007-122589 | 5/2007 |

OTHER PUBLICATIONS

Li, Xin, "Finding Deterministic Solution from Underdetermined Equation: Large-Scale Performance Modeling by Least Angle Regression", Design Automation Conference, Jul. 26-31, 2009, pp. 364-369.

(Continued)

*Primary Examiner* — Thuan Do
*Assistant Examiner* — Brian Ngo
(74) *Attorney, Agent, or Firm* — Fujitsu Patent Center

(57) ABSTRACT

A circuit design support method that is executed by a computer, includes calculating a first performance value of a circuit under design before a layout process, by inputting into a first function model that represents a performance value of the circuit under design before the layout process, the values of parameters among parameters of a second parameter group and corresponding to parameters of a first parameter group; acquiring a second performance value that is of the circuit under design after the layout process and obtained by simulating operation of the circuit under design after the layout process, using the values of the parameters of the second parameter group; and generating based on the calculated first performance value, the acquired second performance value, and the second parameter group, a second function model that represents a difference in the performance value of the circuit under design before and after the layout process.

8 Claims, 15 Drawing Sheets

(56) References Cited

U.S. PATENT DOCUMENTS

| | | | |
|---|---|---|---|
| 2009/0265672 A1* | 10/2009 | St.John et al. | 716/5 |
| 2012/0053923 A1* | 3/2012 | Li et al. | 703/14 |
| 2012/0139602 A1* | 6/2012 | Sakata | 327/262 |
| 2013/0091478 A1* | 4/2013 | Li et al. | 716/112 |
| 2013/0290916 A1* | 10/2013 | Lee et al. | 716/102 |
| 2013/0298091 A1* | 11/2013 | Lee et al. | 716/102 |

OTHER PUBLICATIONS

Li, Xin et al., "Statistical Regression for Efficient High-Dimensional Modeling of Analog and Mixed-Signal Performance Variations", Design Automation Conference, Jun. 8-13, 2008, pp. 38-43.

Efron, Bradley et al., "Least Angle Regression", Jan. 9, 2003, [online] retrieved on Oct. 18, 2012, from the Internet <URL:http://www.stanford.edu/~hastie/Papers/LARS/LeastAngle_2002.PDF>.

\* cited by examiner

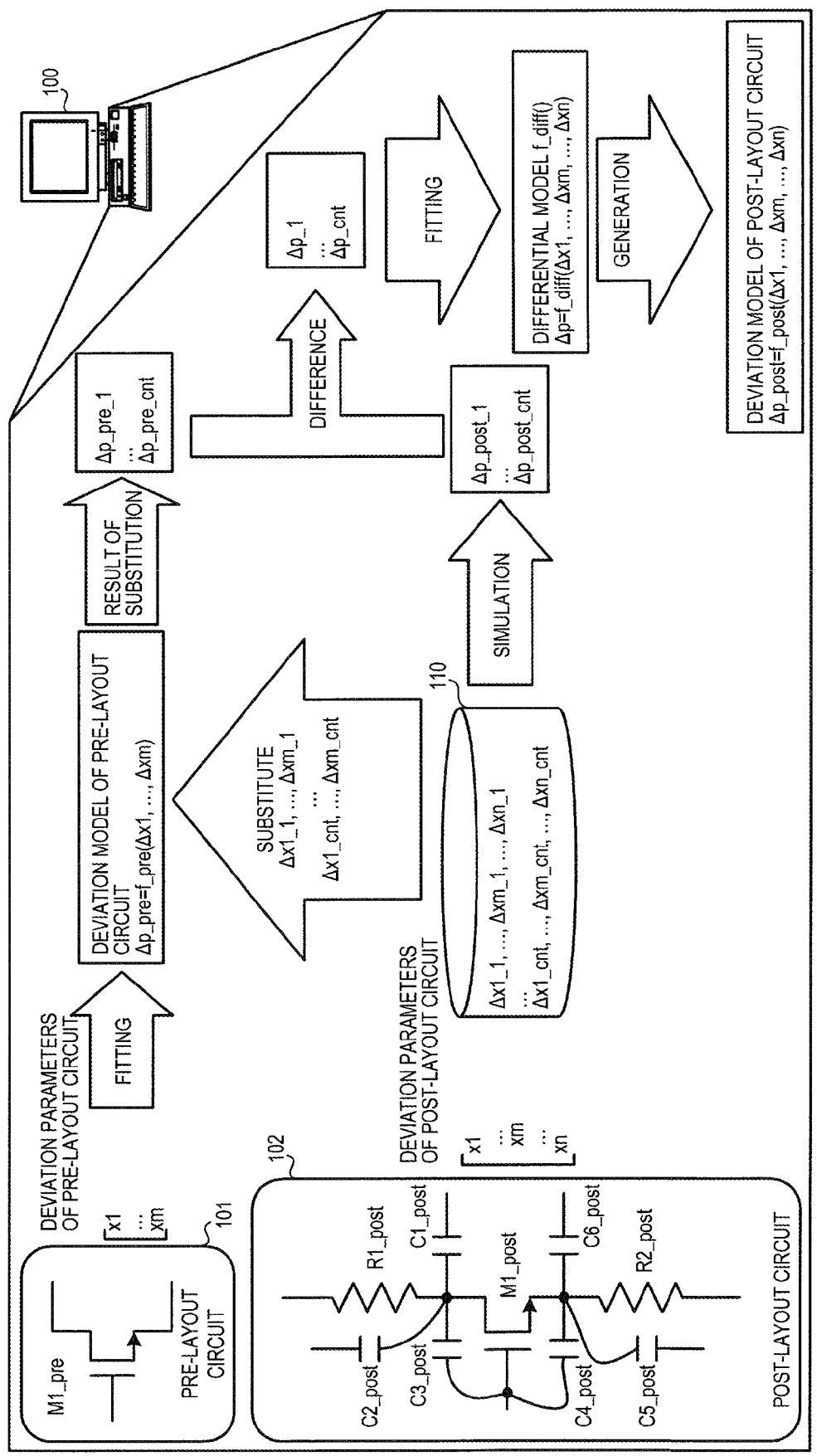

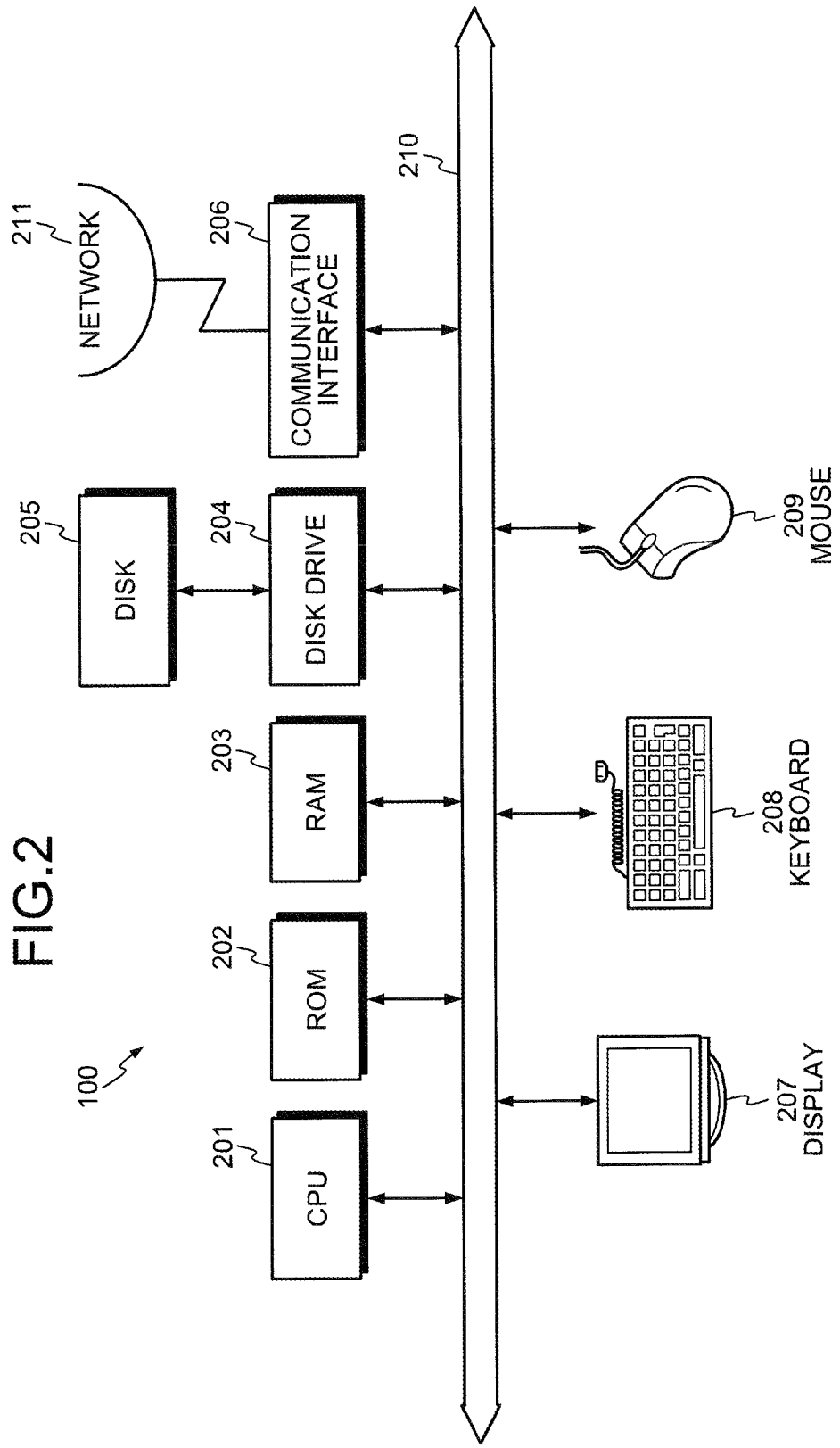

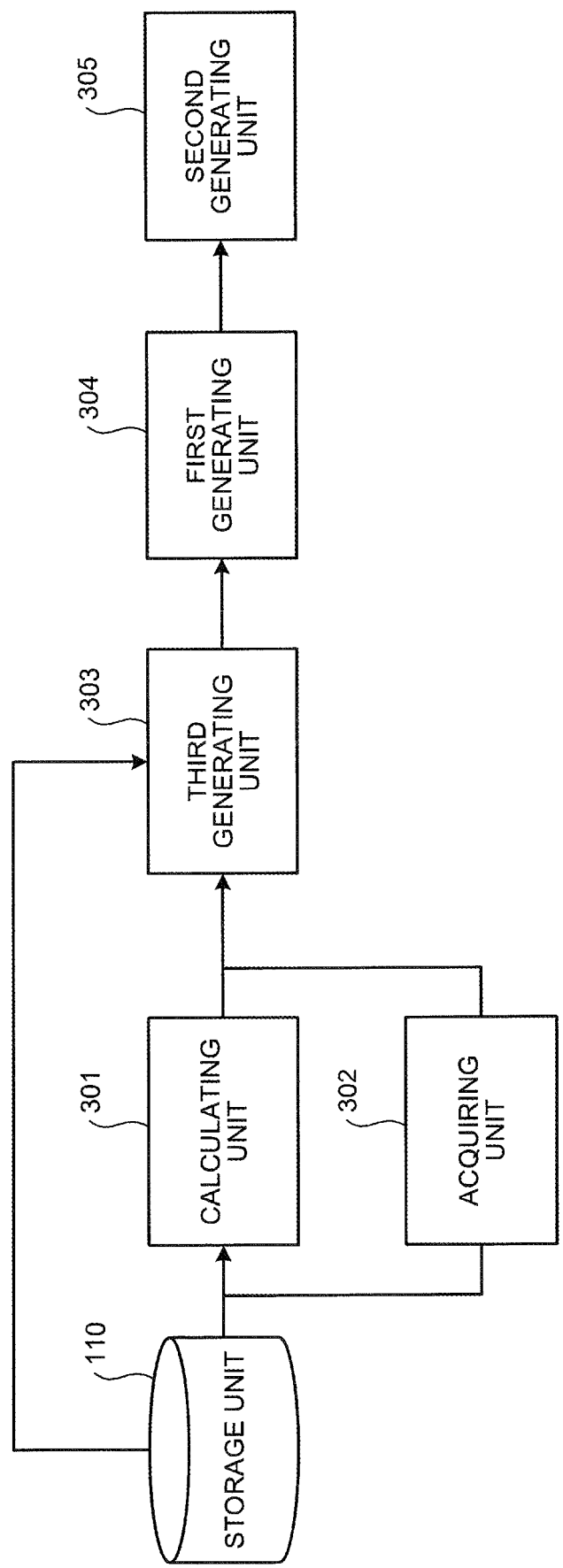

DEVIATION MODEL OF PRE-LAYOUT CIRCUIT
ΔPERFORMANCE VALUE=f_pre(ΔDEVIATION PARAMETER 1, ΔDEVIATION PARAMETER 2, ..., AND ΔDEVIATION PARAMETER m)

DEVIATION MODEL OF PRE-LAYOUT CIRCUIT
Δdelay_pre=f_pre(ΔM1_pre_vth, ΔM1_pre_L, ΔM2_pre_vth, ΔM2_pre_L, ...)
WHEN f_pre() IS LINEAR MODEL,
Δdelay_pre=a1*ΔM1_pre_vth+a2*ΔM1_pre_L+a3*ΔM2_pre_vth+a4*ΔM2_pre_L+...

FIG.5A

| | SAMPLING DATA GROUP OF POST-LAYOUT CIRCUIT ~501 | | | |
|---|---|---|---|---|
| | ΔDEVIATION PARAMETER 1 | ΔDEVIATION PARAMETER 2 | ... | ΔDEVIATION PARAMETER n ~501-1 |
| ΔPERFORMANCE VALUE 1 | ΔDEVIATION PARAMETER 1_1 | ΔDEVIATION PARAMETER 2_1 | ... | ΔDEVIATION PARAMETER n_1 |
| ... | ... | ... | ... | ... |
| ΔPERFORMANCE VALUE_cnt | ΔDEVIATION PARAMETER 1_cnt | ΔDEVIATION PARAMETER 2_cnt | ... | ΔDEVIATION PARAMETER n_cnt ~501-cnt |

FIG.5B

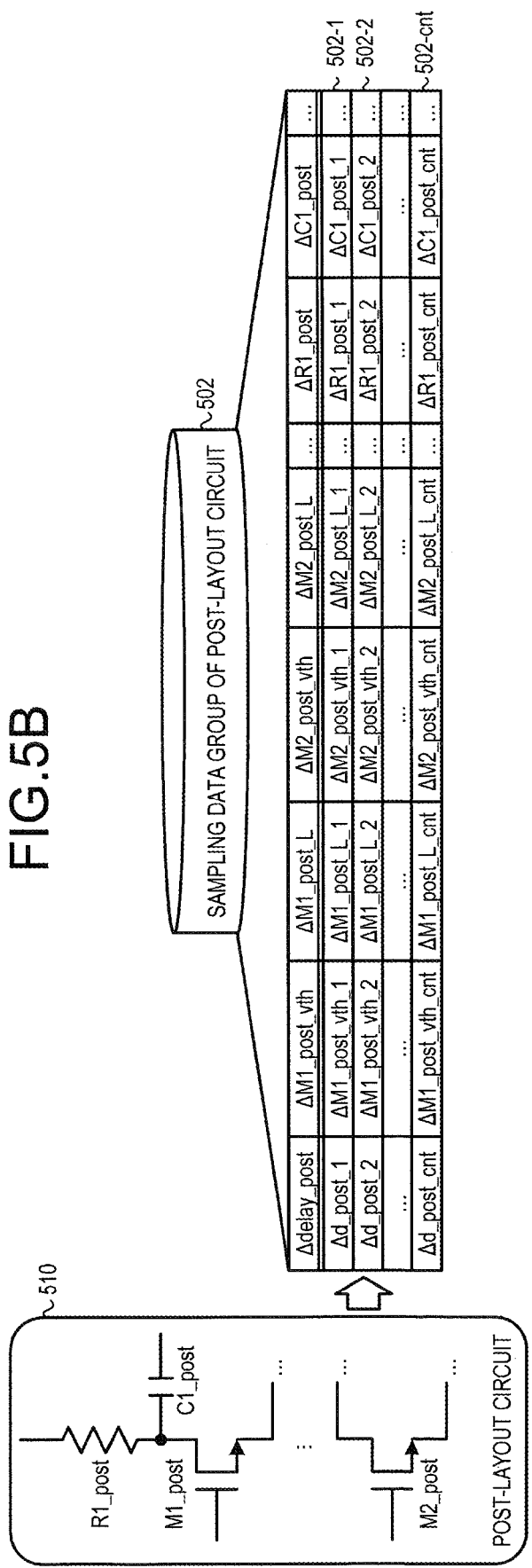

| | SAMPLING DATA GROUP OF POST-LAYOUT CIRCUIT ~502 | | | | | | | |
|---|---|---|---|---|---|---|---|---|
| Δdelay_post | ΔM1_post_vth | ΔM1_post_L | ... | ΔM2_post_vth | ΔM2_post_L | ... | ΔR1_post | ΔC1_post |
| Δd_post_1 | ΔM1_post_vth_1 | ΔM1_post_L_1 | ... | ΔM2_post_vth_1 | ΔM2_post_L_1 | ... | ΔR1_post_1 | ΔC1_post_1 |
| Δd_post_2 | ΔM1_post_vth_2 | ΔM1_post_L_2 | ... | ΔM2_post_vth_2 | ΔM2_post_L_2 | ... | ΔR1_post_2 | ΔC1_post_2 |
| ... | ... | ... | ... | ... | ... | ... | ... | ... |
| Δd_post_cnt | ΔM1_post_vth_cnt | ΔM1_post_L_cnt | ... | ΔM2_post_vth_cnt | ΔM2_post_L_cnt | ... | ΔR1_post_cnt | ΔC1_post_cnt |

FIG.9

DIFFERENTIAL DATA Δd=Δdelay_post-Δdelay_pre $$\begin{bmatrix} \Delta d\_1 \\ \Delta d\_2 \\ \ldots \\ \Delta d\_cnt \end{bmatrix} = \begin{bmatrix} \Delta d\_post\_1 \\ \Delta d\_post\_2 \\ \ldots \\ \Delta d\_post\_cnt \end{bmatrix} - \begin{bmatrix} \Delta d\_pre\_1 \\ \Delta d\_pre\_2 \\ \ldots \\ \Delta d\_pre\_cnt \end{bmatrix}$$

FIG.12

DEVIATION MODEL OF POST-LAYOUT CIRCUIT f_post()
f_post()=f_pre()+f_diff()
WHEN f_pre() AND f_diff() ARE LINEAR MODELS,
f_post()=(a1+ad1)*ΔM1_post_vth+(a2+ad2)*ΔM1_post_L+(a3+ad3)*ΔM2_post_vth+(a4+ad4)*ΔM2_post_L+...+ad5*ΔR1_post+ad6*ΔC1_post+...

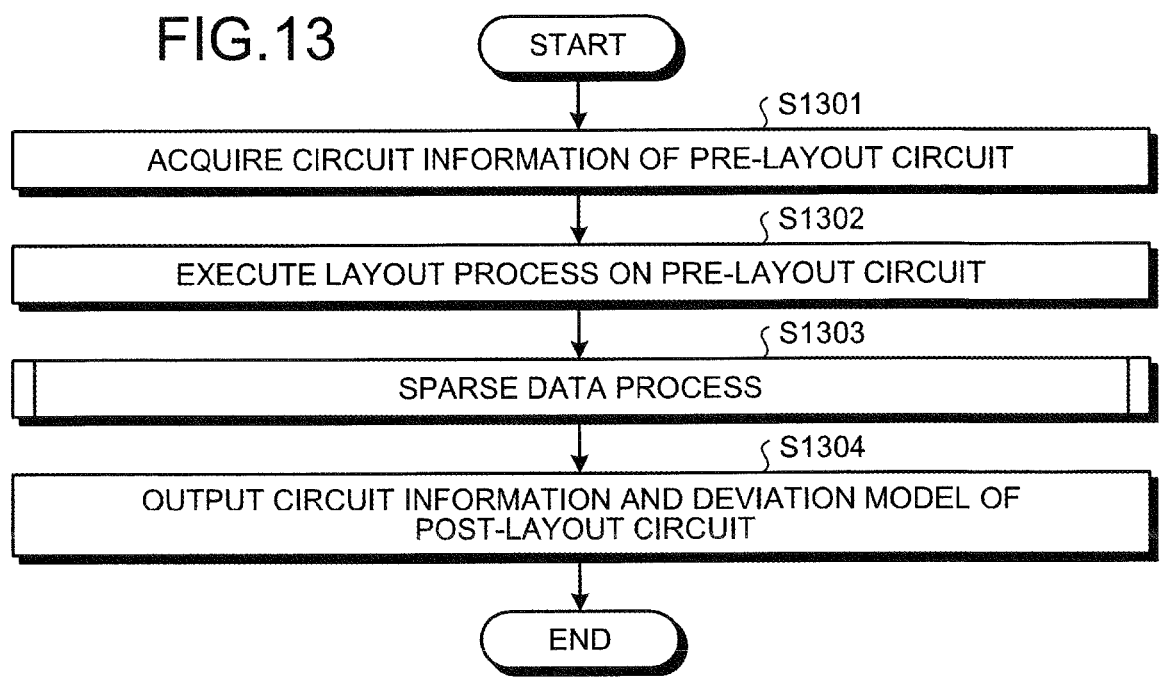

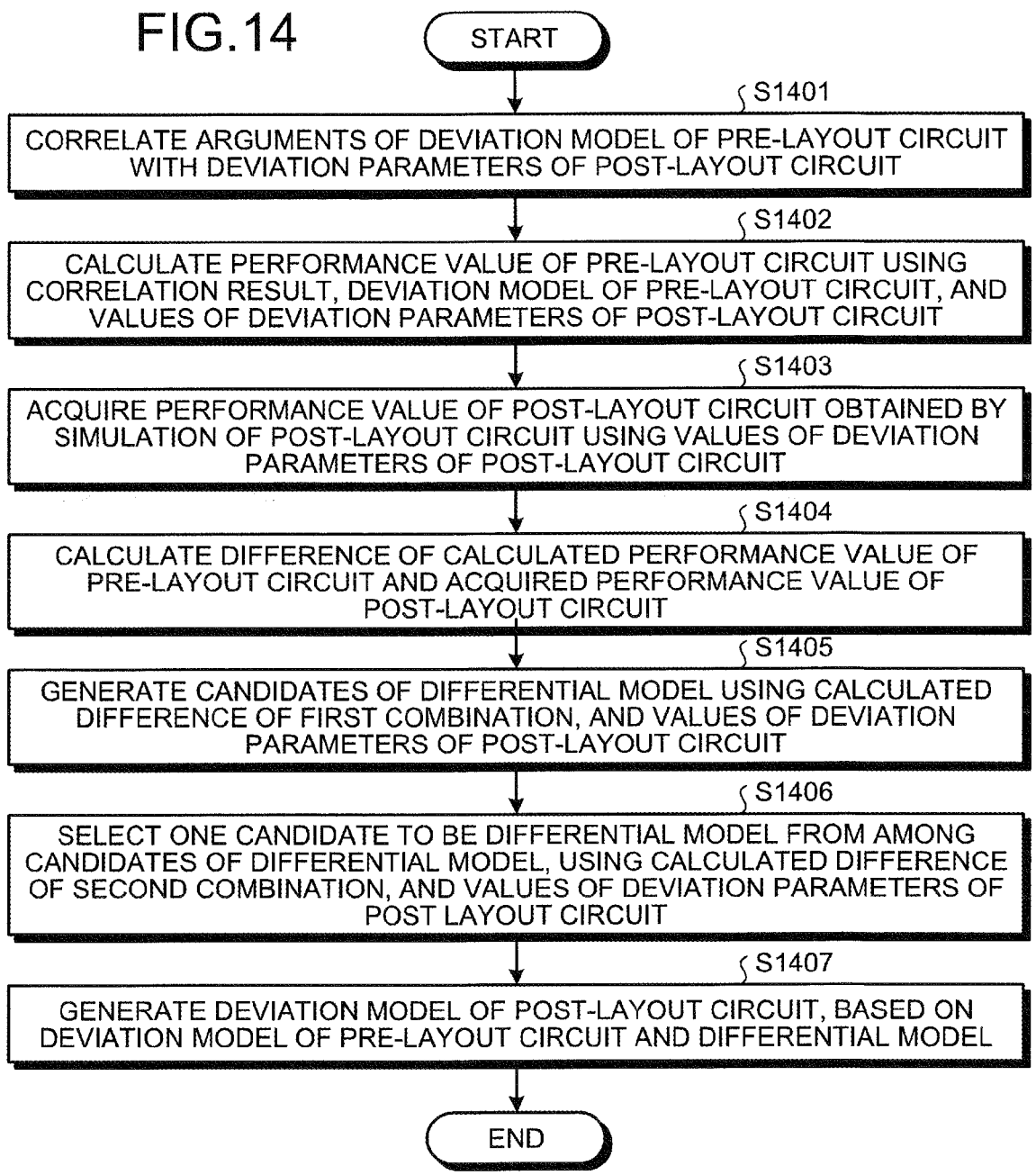

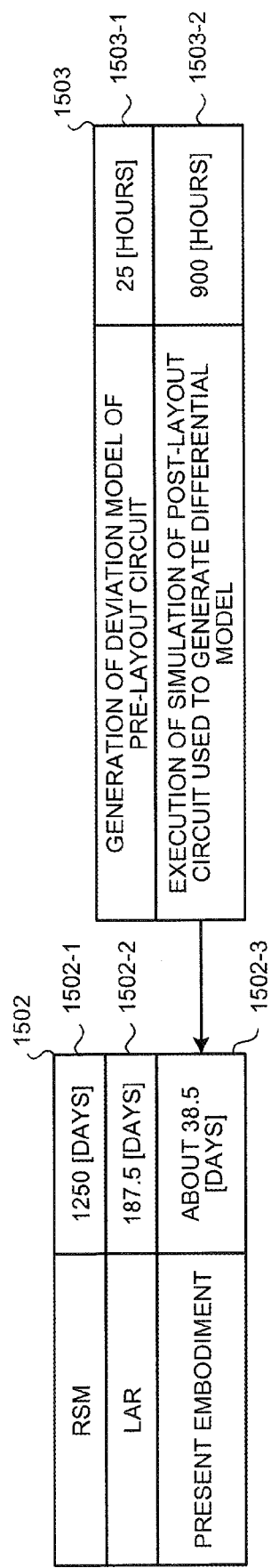

CIRCUIT DESIGN SUPPORT METHOD, CIRCUIT DESIGN SUPPORT APPARATUS, AND COMPUTER PRODUCT

CROSS REFERENCE TO RELATED APPLICATIONS

This application is based upon and claims the benefit of priority of the prior Japanese Patent Application No. 2012-276296, filed on Dec. 18, 2012, the entire contents of which are incorporated herein by reference.

FIELD

The embodiments discussed herein are related to circuit design support.

BACKGROUND

According to a conventional technique, to analyze performance differences of a circuit, a function model is generated that provides a performance value of the circuit using parameters that represent properties of elements included in the circuit. For example, according to one technique, when parameters that affect the performance of a circuit are very few among a group of parameters that represent the properties of elements included in the circuit, the amount of sampling data used to acquire the coefficients of the parameters is reduced and the function model is generated.

For example, according to a related technique, a waveform and input data generated by a circuit simulator are analyzed; whereby, circuit parameter update information is generated; network list data is updated based on the circuit parameter update information; and the circuit simulator is recursively operated. According to another technique, a combination of values of properties of a circuit (a combination by which a circuit property is most degraded) is selected for each circuit property; a value of each of the properties of the circuit is acquired such that each circuit property satisfies a target specification subject to the combination of values for each circuit property acquired in the selection process (see, for example, Japanese Laid-Open Patent Publication Nos. 2007-122589 and 2004-145410; Xin Li, "Finding Deterministic Solution from Underdetermined Equation: Large-Scale Performance Modeling by Least Angle Regression", Design Automation Conference, 2009, pp. 364-369; and Xin Li, et al, "Statistical Regression for Efficient High-Dimensional Modeling of Analog and Mixed-Signal Performance Variations", Design Automation Conference, 2008, pp. 38-43).

However, according to the conventional techniques, the accuracy of the function model providing the performance value of a circuit may decrease as the number of parameters affecting the performance of the circuit increases among the group of parameters that represent the properties of the elements included in the circuit. More sampling data has to be prepared to suppress decreases in accuracy and therefore, it takes a long time to generate the function model.

SUMMARY

According to an aspect of an embodiment, a circuit design support method that is executed by a computer, includes calculating a first performance value of a circuit under design before a layout process, the first performance value being calculated by using a first parameter group that represents properties of elements of the circuit under design before the layout process, to refer to a storage unit that stores values of parameters of a second parameter group that represent properties of the elements of the circuit under design after the layout process, and inputting into a first function model that represents a performance value of the circuit under design before the layout process, the values of the parameters that are among the parameters of the second parameter group and correspond to parameters of a first parameter group; acquiring a second performance value of the circuit under design after the layout process, the second performance value being obtained by simulating operation of the circuit under design after the layout process, using the values of the parameters of the second parameter group stored in the storage unit; and generating a second function model that represents a difference in the performance value of the circuit under design before and after the layout process, the second function model being generated based on the calculated first performance value, the acquired second performance value, and the values of the parameters of the second parameter group stored in the storage unit and by using the second parameter group.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an explanatory diagram of an example of operation of a circuit design support apparatus according to an embodiment;

FIG. 2 is a block diagram of a hardware configuration of the circuit design support apparatus;

FIG. 3 is a block diagram of an example of a functional configuration of the circuit design support apparatus;

FIGS. 5A and 5B are explanatory diagrams of an example of sampling data of a post-layout circuit;

FIG. 9 is another explanatory diagram of the example of generation of the differential data of the performance;

FIG. 12 is an explanatory diagram of an example of generation of a deviation model of the post-layout circuit;

FIG. 13 is a flowchart of an example of a procedure for a post-layout circuit generation process;

FIG. 14 is a flowchart of an example of a procedure for a sparse data process; and FIGS. 15A and 15B are explanatory diagrams of an example of comparison among time periods each consumed for the generation of the deviation model of the post-layout circuit.

DESCRIPTION OF EMBODIMENTS

Figures 4A, 4B:
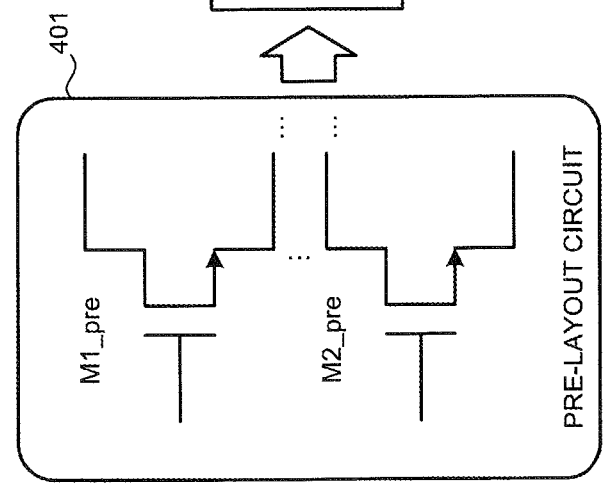
FIGS. 4A and 4B are explanatory diagrams of an example of a deviation model of a pre-layout circuit.

Embodiments of a circuit design support method, a circuit design support apparatus, and a circuit design support program will be described in detail with reference to the accompanying drawings.

FIG. 1 is an explanatory diagram of an example of operation of a circuit design support apparatus according to an embodiment. The circuit design support apparatus 100 is a computer that supports the design of a circuit. A procedure will be described for a design process executed when a circuit under design is an analog circuit. A first process of the design process is a process of determining circuit topology and determining parameters that represent the properties of elements. "Circuit topology" refers to element connections. Information indicating the connections of elements will hereinafter be referred to as "circuit information". A "parameter representing a property of an element" is a value that represents a property of an element such as a resistance value or a capacitance value. A "parameter representing a property of an element" will hereinafter be referred to as "deviation parameter". A second process is a process of validating the circuit design determined at the first process and determining whether the circuit design satisfies the specification.

If it is determined that the circuit design satisfies the specification at the second process, a third process is a process of executing a layout process. The execution of the layout process causes the circuit information to include layout parasitic elements. The layout parasitic elements are, for example, layout wiring capacitance and wiring resistance. A "circuit under design before the layout process is executed" will hereinafter be referred to as "pre-layout circuit" and the "circuit under design after the layout process is executed" will hereinafter be referred to as "post-layout circuit".

A fourth process is a process of executing physical validation for the circuit information after the layout process is executed. The "physical validation" can be, for example, a design rule check (DRC) or a layout versus schematic (LVS).

A fifth process is a process of determining whether the performance value of the circuit satisfies the specification of the deviation, for the circuit information for which the physical validation is executed. For the circuit information for which it is determined at the fifth process that the performance value of the circuit satisfies the specification of the deviations, a circuit according to the circuit information is fabricated by a fabricating process. Determination of whether the performance satisfies the specification of the deviation is performed because as the configuration becomes finer, deviations in performance occur and when the deviation becomes significant, a greater number of circuits whose performance departs from the range of the specifications arise; and consequently, yield drops. The "performance" is, for example, the oscillation frequency or delay amount. For example, in a simulation, one value can be acquired for the oscillation frequency of a circuit. However, the values of the oscillation frequencies of the circuits actually manufactured differ according to circuit and are deviated values. Therefore, the execution of the fifth process enables suppression of the departure of performance from the range of the specifications.

To analyze deviations in performance, a deviation model of the post-layout circuit is generated and the source of performance deviations is analyzed. The analysis of the source of performance deviations enables improvement of the yield. A deviation model "f( )" is a model expressed by a function and can be expressed by, for example, Eq. (1) below.

$$\Delta p = f(\Delta x1, \Delta x2, \ldots, \Delta xn) \quad (1)$$

A specific example of the deviation model f( ) can be, for example, Eq. (2).

$$\Delta p = a1*\Delta x1 + a2*\Delta x2 + \ldots + an*\Delta xn \quad (2)$$

Eq. (2) is an equation used when the deviation model f( ) is a linear model. The deviation model f( ) may be a non-linear model. For example, a non-linear model prepared in advance may be applied as the deviation model f( ). In Eqs. (1) and (2), "p" represents the performance value of the post-layout circuit. "x1, x2, . . . , and xn" represent a deviation parameter group representing the properties of the elements of the post-layout circuit. "a1", "a2", . . . , and "an" are coefficients acquired by executing fitting for the post-layout circuit using sampling data acquired by simulating the operation based on a simulation program with integrated circuit emphasis (SPICE), etc. The "simulation of the operation" means execution of a simulation based on the SPICE, etc. The "simulation of the operation" will hereinafter be referred to as "simulation". "Δ" is an operator symbol executing Eq. (3) below.

$$\Delta x = x - (\text{average of } x) \quad (3)$$

From Eq. (3), for example, $\Delta p$ is "p− (average value of p)". The "differential value from the average value" will hereinafter be referred to as "deviation".

The sampling data have to be acquired to generate the deviation model. However, the number of elements in the post-layout circuit is tremendous and therefore, much time is consumed for executing one simulation. When the number of elements in the post-layout circuit is tremendous, the number of deviation parameters is tremendous and the number of simulations also increases. Therefore, much time is consumed for generating the deviation model of the post-layout circuit.

Methods of generating the deviation model include, for example, two methods as below. The first one is a response surface methodology (RSM) and the second one is a method using a sparsity property. For the RSM, sampling data of a number equal to or greater than the number of deviation parameters of the post-layout circuit have to be prepared to be set in the deviation parameter group.

The method using the sparsity property is a method utilizing a sparsity property, which is the deviation parameters among the deviation parameter group of the post-layout circuit and that affect the performance being very few among the deviation parameters overall. The degree of the sparsity property can be represented by ratios of the sampling data and the deviation parameters affecting the performance. A method using the sparsity property can be, for example, least angle regression (LAR) or statistic regression (STAR). The details of the LAR are described in by Bradley Efron, et al, "Least Angle Regression", [online], retrieved on Oct. 18, 2012, from the Internet.

The deviation parameters that affect the performance differ depending on the type of performance such as the oscillation frequency and the delay amount. The sparsity property is enhanced as the number of sampling data becomes greater than the number of deviation parameters that affect performance. When the value of the sparsity property is small, according to the method using the sparsity property, error of the deviation model becomes significant and a low accuracy deviation model is generated. To improve the accuracy, many sampling data have to be prepared and much time is consumed for generating the deviation model.

The circuit design support apparatus 100 according to the embodiment generates a differential model representing the difference in the performance. The differential model is generated from the difference in the performance between the circuits before and after the layout process is executed and the values of the deviation parameters of the post-layout circuit. The number of deviation parameters affecting the difference of the differential model is smaller than the number of deviation parameters affecting the performance of the deviation model of the post-layout circuit because the parameters affecting the performance of the pre-layout circuit do not have to be taken into consideration. The number of elements of the pre-layout circuit is smaller than that of the post-layout circuit and therefore, the time period consumed for generating a highly accurate function model of the pre-layout circuit is short. Based on the above, the circuit design support apparatus 100 generates at a high speed, a high accuracy function model of the post-layout circuit, from the high accuracy differential model generated using the sparsity property and the high accuracy function model of the pre-layout circuit.

In the description below, the number of deviation parameters of the deviation model of the post-layout circuit is represented by "n" and the number of deviation parameters of the deviation model of the pre-layout circuit is represented by "m". "n" is a value greater than "m". The number of combinations is represented by "cnt". The combinations are each acquired by gathering together the values of the deviation parameters of each deviation model of the post-layout circuit.

In FIG. 1, the circuit design support apparatus 100 acquires the circuit information of a pre-layout circuit 101. The pre-layout circuit 101 includes a transistor M1_pre. A first deviation parameter group representing the properties of the elements of the pre-layout circuit 101 includes m parameters that are x1, . . . , and xm. The circuit design support apparatus 100 executes the layout process for the pre-layout circuit 101 to acquire the circuit information of a post-layout circuit 102. The post-layout circuit 102 includes a transistor M1_post; and C1_post to C6_post, R1_post, and R2_post as layout parasitic elements generated by the layout process. A second deviation parameter group representing the properties of the elements of the post-layout circuit 102 includes n parameters that are x1, . . . , xm, . . . , and xn.

The circuit design support apparatus 100 prepares sampling data of the first deviation parameter group; executes a simulation; thereby, acquires the performance value of the pre-layout circuit 101; executes fitting using the sampling data and the performance value; and thereby, generates a deviation model f_pre( ) as a first function model representing the performance value of the pre-layout circuit using the first deviation parameter group. The deviation model f_pre( ) is, for example, Eq. (4) below.

$$\Delta p\_pre = f\_pre(\Delta x1, \ldots, \Delta xm) \quad (4)$$

In the above, "$\Delta p\_pre$" represents the deviation of the performance value of the pre-layout circuit 101. The circuit design support apparatus 100 prepares the values of the parameters of the second deviation parameter group, executes a simulation, and thereby, acquires the performance value of the post-layout circuit 102. For example, the prepared values of the second deviation parameter group are $\Delta x1\_1, \ldots, \Delta xm\_1, \ldots, \Delta xn\_1, \ldots, \Delta x1\_cnt, \ldots, \Delta xm\_cnt, \ldots,$ and $\Delta xn\_cnt$. The values of the parameters of the second deviation parameter group are stored in a storage unit 110 of the circuit design support apparatus 100.

The circuit design support apparatus 100 inputs from among the second deviation parameter group stored in the storage unit 110, values of the parameters corresponding to those in the first deviation parameter group and thereby, calculates a first performance value of the pre-layout circuit 101. The parameters corresponding to those in the first deviation parameter group of the second deviation parameter group are parameters of the elements present in the pre-layout circuit 101. For example, the circuit design support apparatus 100 substitutes $\Delta x1\_1, \ldots,$ and $\Delta xm\_1$ in f_pre( ); calculates $\Delta p\_pre\_1$ as the first performance value; substitutes $\Delta x1\_cnt, \ldots,$ and $\Delta xm\_cnt$ in f_pre( ); and calculates $\Delta p\_pre\_cnt$ as the first performance value.

The circuit design support apparatus 100 acquires a second performance value of the post-layout circuit 102 that is acquired by executing a simulation for the post-layout circuit 102 using the values of the parameters of the second deviation parameter group stored in the storage unit 110. For example, the circuit design support apparatus 100: acquires $\Delta p\_post\_1$ as the second performance value of the post-layout circuit 102 that is acquired by executing a simulation for the post-layout circuit 102 using $\Delta x1\_1, \ldots, \Delta xm\_1, \ldots,$ and $\Delta xn\_1$; continues the same process; and thereby, acquires $\Delta p\_post\_cnt$ as the second performance value of the post-layout circuit 102 that is acquired by executing a simulation for the post-layout circuit 102 using $\Delta x1\_cnt, \ldots, \Delta xm\_cnt, \ldots,$ and $\Delta xn\_cnt$.

The circuit design support apparatus 100 generates the differential model f_diff( ) as a second function model based on the first and the second performance values and the values of the parameters of the second deviation parameter group. The differential model f_diff( ) is a function model that represents the difference in the performance value between the pre-layout and the post-layout circuits 101 and 102 using the second deviation parameter group.

For example, the circuit design support apparatus 100 calculates the difference between the first and the second performance values. In the example of FIG. 1, the circuit design support apparatus 100 calculates $\Delta p\_post\_1 - \Delta p\_pre\_1 = \Delta p\_1$; calculates . . . , $\Delta p\_post\_cnt - \Delta p\_pre\_cnt = \Delta p\_cnt$; and calculates the differential model f_diff( ) by executing the fitting using $\Delta p\_1, \ldots,$ and $\Delta p\_cnt$, and the values of the parameters of the second deviation parameter group. The differential model f_diff( ) is, for example, Eq. (5) below.

$$\Delta p = f\_diff(\Delta x1, \ldots, \Delta xm, \ldots, \Delta xn) \quad (5)$$

In the above, "$\Delta p$" represents the difference in the performance value between the pre-layout and the post-layout circuits 101 and 102. The circuit design support apparatus 100 generates a deviation model f_post( ) of the post-layout circuit 102 as a third function model based on the differential model f_diff( ) and the deviation model f_pre( ). For example, f_post( ) is Eq. (6) below.

$$\Delta p\_post = f\_post(\Delta x1, \ldots, \Delta xm, \ldots, \Delta xn) \quad (6)$$

The deviation model f_post( ) is a function model representing the performance value of the post-layout circuit 102 using the second deviation parameter group. The execution of the above process enables the circuit design support apparatus 100 to generate the deviation model f_post( ) of the post-layout circuit 102.

The number of deviation parameters affecting the performance of f_diff( ) is the number acquired by subtracting the number of deviation parameters affecting the performance of f_pre( ) from the number of deviation parameters affecting the performance of f_post( ). Therefore, the number of deviation parameters affecting the performance of f_diff( ) is smaller than that of the deviation parameters affecting the performance of f_post( ). Thus, when the circuit design support apparatus 100 generates f_diff( ), the circuit design support apparatus 100 can generate a highly accuracy model even with a fewer number of sampling data. Details of the circuit design support apparatus 100 will be described with reference to FIGS. 2 to 15.

FIG. 2 is a block diagram of a hardware configuration of the circuit design support apparatus. As depicted in FIG. 2, the circuit design support apparatus 100 includes a central processing unit (CPU) 201, read-only memory (ROM) 202, random access memory (RAM) 203, a disk drive 204, a disk 205, a communication interface 206, a display 207, a keyboard 208, a mouse 209, and the rendering apparatus 101, respectively connected by a bus 210.

The CPU 201 is a computation processing apparatus that governs overall control of the circuit design support apparatus 100. The ROM 202 is non-volatile memory that stores programs such a boot program. The RAM 203 is volatile memory used as a work area of the CPU 201.

The disk drive 204, under the control of the CPU 201, controls the reading and writing of data with respect to the disk 205. For example, a magnetic disk drive, a solid state drive, and the like may be adopted as the disk drive 204. The disk 205 is non-volatile memory that stores data written thereto under the control of the disk drive 204. For example, when the disk drive 204 is a magnetic disk drive, the disk 205 may be a magnetic disk. When the disk drive 204 is an optical disk drive, the disk 205 may be an optical disk. Further, when the disk drive 204 is a solid state drive, the disk 205 may be semiconductor memory.

The communication interface 206 is a control apparatus that administers an internal interface with a network 211 and controls the input and output of data with respect to other apparatuses. The communication interface 206 is connected, via a communication line, to the network 211, which may be a local area network (LAN), a wide area network (WAN), the Internet, and the like. For example, a modem or a LAN adaptor may be employed as the communication apparatus 206.

The display 207 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 207.

The keyboard 208 includes, for example, keys for inputting letters, numerals, and various instructions and performs the input of data. Alternatively, a touch-panel-type input pad or numeric keypad, etc. may be adopted. The mouse 209 is used to move the cursor, select a region, or move and change the size of windows. A track ball or a joy stick may be adopted provided each respectively has a function similar to a pointing device.

A functional configuration of the circuit design support apparatus 100 will be described. FIG. 3 is a block diagram of an example of a functional configuration of the circuit design support apparatus. The circuit design support apparatus 100 includes a calculating unit 301; an acquiring unit 302; and a third, a first, and a second generating units 303, 304, and 305. Functions of the calculating unit 301 to the second generating unit 305, forming a control unit, are implemented by causing the CPU 201 to execute programs stored in a storage apparatus. The storage apparatus is, for example, the ROM 202, the RAM 203, or the disk 205 depicted in FIG. 2. The above functions may be implemented by causing another CPU to execute the programs through the communication interface 206.

The circuit design support apparatus 100 can access the storage unit 110. The storage unit 110 is stored in a storage apparatus such as the RAM 203 or the disk 205. The storage unit 110 stores the values of the parameters of the second deviation parameter group, which represents the properties of the elements in the post-layout circuit 102. For example, the storage unit 110 stores $\Delta x1\_1, \ldots, \Delta xm\_1, \ldots,$ and $\Delta xn\_1$ that are the values of $x1, \ldots, xm, \ldots,$ and $xn$ as the second deviation parameter group. The storage unit 110 may store plural types of combinations that include the values of the parameters of the second deviation parameter group. For example, the storage unit 110 may store cnt types of combination such as a combination of $\Delta x1\_1, \ldots, \Delta xm\_1, \ldots,$ and $\Delta xn\_1$; a combination of $\Delta x1\_2, \ldots, \Delta xm\_2, \ldots,$ and $\Delta xn\_2$; and a combination of $\ldots, \Delta x1\_cnt, \ldots, \Delta xm\_cnt, \ldots,$ and $\Delta xn\_cnt$.

The post-layout circuit 102 may be a circuit that satisfies the design rules of the process.

Satisfying the DRC causes the post-layout circuit 102 to satisfy the design rules of the process. The post-layout circuit 102 may be a circuit having connection relations among the elements that correspond to the elements of the pre-layout circuit 101 of the elements of the post-layout circuit 102 that matches the connection relation of the elements of the pre-layout circuit 101. Satisfying the LVS causes the connection relations to match.

The calculating unit 301 refers to the storage unit 110, inputs into the first function model, the values of the parameters corresponding to the parameters of the first deviation parameter group of the second deviation parameter group and thereby, calculates the first performance value of the pre-layout circuit 101. The first function model is a function model that represents the performance value of the pre-layout circuit 101 using the first parameter group. The performance value represented by the first function model may be the performance value itself or may be the difference from the average value of the performance value.

For example, when a portion of the names and identification information of the parameters of the second deviation parameter group matches those of a parameter of the first deviation parameter group, the calculating unit 301 identifies the parameter as a corresponding parameter, as an example where the corresponding parameter is identified.

In the example of FIG. 1, the calculating unit 301 inputs into the first function model the values $\Delta x1\_1, \ldots,$ and $\Delta xm\_1$, of the parameters $x1, \ldots,$ and $xm$ corresponding to those of the first deviation parameter group of $x1, \ldots, xm, \ldots,$ and $xn$ and thereby, calculates the first performance value $\Delta p\_pre\_1$.

The calculating unit 301 may input into the first function model, the values of the parameters that correspond to those of the first deviation parameter group and that are among the values of the parameters of the second deviation parameter group included in the combination and thereby, may calculate the first performance value of the pre-layout circuit 101 corresponding to the combination. For example, the calculating unit 301 inputs into the first function model, $\Delta x1\_1, \ldots,$ and $\Delta xm\_1$ of the combination of $\Delta x1\_1, \ldots, \Delta xm\_1, \ldots,$ and $\Delta xn\_1$; and calculates the first performance value $\Delta p\_pre\_1$. The calculating unit 301 inputs into the first function model, $\Delta x1\_cnt, \ldots,$ and $\Delta xm\_cnt$ of the combination of $\Delta x1\_cnt, \ldots, \Delta xm\_cnt, \ldots,$ and $\Delta xn\_cnt$; and calculates the first performance value $\Delta p\_pre\_cnt$. The calculated first performance value is stored in the storage apparatus such as the RAM 203 or the disk 205.

The acquiring unit 302 acquires the second performance value of the post-layout circuit 102 that is acquired by executing the simulation for the post-layout circuit 102 using the values of the parameters of the second deviation parameter group stored in the storage unit 110. In the example of FIG. 1, the acquiring unit 302 acquires the second performance value $\Delta p\_post\_1$ that is acquired by executing the simulation using $\Delta x1\_1, \ldots, \Delta xn\_1, \ldots,$ and $\Delta xn\_1$. The apparatus executing the simulation may be the circuit design support apparatus 100 or may be another apparatus.

The acquiring unit 302 may acquire, corresponding to the combination, the second performance value of the post-layout circuit 102 that is acquired by simulating the operation of the post-layout circuit 102 using the values of the parameters of the second deviation parameter group included in the combination stored in the storage unit 110. Using the example of FIG. 1, the acquiring unit 302 acquires the second performance value $\Delta p\_post\_1$ that is acquired by executing the simulation using $\Delta x1\_1, \ldots, \Delta xm\_1, \ldots,$ and $\Delta xn\_1$. The acquiring unit 302 acquires the second performance value $\Delta p\_post\_cnt$ that is acquired by executing the simulation using $\Delta x1\_cnt, \ldots, \Delta xm\_cnt, \ldots,$ and $\Delta xn\_cnt$. The acquired second performance value is stored in the storage apparatus such as the RAM 203 or the disk 205.

The third generating unit 303 generates based on the information as below, candidates for the second function model using a portion of the parameters corresponding to the combination of the portion of the parameters selected from the second deviation parameter group. The "information as below" refers to, of the plural combinations stored in the storage unit 110, the first performance value corresponding to a first combination, the second performance value corresponding to the first combination, and the values of the parameters of the second deviation parameter group included in the first combination. The second function model is a function model that represents the difference in the performance value between the pre-layout and the post-layout circuits 101 and 102 using the second deviation parameter group. The performance value represented by the second function model may be the performance value itself or may be the difference from the average value of the performance value.

For example, the third generating unit 303 generates a first candidate for the second function model using x1 that is most highly correlated therewith according to the LAR as a portion of the parameters of x1, ..., xm, ..., and xn; and also generates a second candidate for the second function model using x1 that is most highly correlated therewith and x2 that is secondly most highly correlated therewith according to the LAR. In this manner, the third generating unit 303 selects the parameters in order of weakening correlation and generates plural candidates for the second function model using the selected parameters. The generated candidates for the second function model are stored in a storage apparatus such as the RAM 203 or the disk 205.

The first generating unit 304 generates the second function model based on the first performance value calculated by the calculating unit 301, the second performance value acquired by the acquiring unit 302, and the values of the parameters of the second deviation parameter group. For example, the first generating unit 304 generates the second function model using the method such as the LAR or the STAR. For example, the first generating unit 304 selects one candidate that is to be the second function model according to the index presented by the Akaike's information criterion (AIC), from the plural candidates generated based on the LAR for the second function model.

The first generating unit 304 may generate the second function model based on the first performance value corresponding to the combination calculated by the calculating unit 301, the second performance value corresponding to the combination acquired by the acquiring unit 302, and the values of the parameters of the second deviation parameter group included in the combination. For example, the first generating unit 304 generates the second function model based on $\Delta p\_post\_1, \Delta p\_pre\_1, \Delta x1\_1, \ldots,$ and $\Delta xn\_1$.

The first generating unit 304 may select the candidate to be the second function model based on the first and the second performance values corresponding to the second combination and the values of the parameters of the second deviation parameter group included in the second combination, from the candidates for the second function model generated by the third generating unit 303 corresponding to the combinations. The second combination is a combination different from the first combination of the plural combinations. For example, the third generating unit 303 executes the fitting for the coefficients of the function model applying the cross-validation thereto, based on the first and the second performance values corresponding to the first combination used in the fitting and the values of the parameters of the second deviation parameter group included in the first combination. The first generating unit 304 evaluates the candidates for the second function model using the first and the second performance values corresponding to the second combination not used in the fitting and the values of the parameters of the second deviation parameter group included in the second combination. After the evaluation, the first generating unit 304 determines, for example, that the candidate for the second function model acquiring the highest value in the evaluation is the second function model.

It is assumed, for example, that the third generating unit 303 generates the two candidates for the second function model; the first candidate for the second function model is a function model using x1; and the second one is a function model using x1 and x2. In this case, the first generating unit 304 substitutes the values of the parameters of the second deviation parameter group included in the second combination into the first candidate for the second function model, and acquires the residual error between the value acquired by the substitution and the difference of the first and the second performance values corresponding to the second combination. Similarly, the first generating unit 304 substitutes the values of the parameters of the second deviation parameter group included in the second combination into the second candidate for the second function model, and acquires the residual error between the value acquired by the substitution and the difference of the first and the second performance values corresponding to the second combination. The third generating unit 303 determines that the candidate for the second function model corresponding to the residual error whose absolute value is the smaller is the second function model. The generated second function model is stored to a storage apparatus such as the RAM 203 or the disk 205.

The second generating unit 305 generates the third function model representing the performance value of the post-layout circuit 102 using the second deviation parameter group based on the second and the first function models generated by the first generating unit 304. The performance value represented by the third function model may be the performance value itself or may be the difference from the average value of the performance value.

For example, the second generating unit 305 adds the second function model to the first function model and thereby, generates the third function model. For example, when the first and the second function models are linear models, the second generating unit 305 generates the third function model by adding the coefficient of a deviation parameter of the second deviation parameter group to the coefficient of the corresponding deviation parameter of the first deviation parameter group. In this addition, the second generating unit 305 does not need to add the coefficient at the smaller order when the order of one coefficient significantly differs from the other. The generated third function model is stored to a storage apparatus such as the RAM 203 or the disk 205, and may be transmitted to an apparatus other than the circuit design support apparatus 100.

An example of the deviation model of the pre-layout circuit stored in the circuit design support apparatus 100 will be described with reference to FIGS. 4A and 4B and an example of the sampling data of the post-layout circuit will be described with reference to FIGS. 5A and 5B. It is assumed that the sampling data includes the value of the deviation parameter of the circuit under design and the performance value of the circuit under design acquired by executing a simulation using the deviation parameters.

FIGS. 4A and 4B are explanatory diagrams of an example of the deviation model of the pre-layout circuit. The deviation model of the pre-layout circuit depicted in FIG. 4A is Eq. (7) below.

$$\Delta \text{Performance value} = f\_pre(\Delta \text{deviation parameter 1}, \Delta \text{deviation parameter 2}, \ldots, \text{and } \Delta \text{deviation parameter } m) \quad (7)$$

The deviation model of the pre-layout circuit is acquired by executing the fitting using the sampling data acquired by executing the simulation of the pre-layout circuit. The pre-layout circuit has fewer deviation parameters than those of the post-layout circuit. Therefore, it is easier for the pre-layout circuit to increase the number of simulation data than the post-layout circuit and as a result, a highly accurate deviation model of the pre-layout circuit can be generated.

FIG. 4B depicts a deviation model of a pre-layout circuit 401 concerning the delay amount for the pre-layout circuit 401 that includes the transistor M1_pre and a transistor M2_pre. The deviation model f_pre( ) of the pre-layout circuit 401 depicted in FIG. 4B is Eq. (8) below.

$$\Delta delay\_pre = f\_pre(\Delta M1\_pre\_vth, \Delta M1\_pre\_L, \Delta M2\_pre\_vth, \Delta M2\_pre\_L, \ldots) \quad (8)$$

In the above, "Δdelay_pre" represents the deviation of the delay amount of the pre-layout circuit 401. "ΔM1_pre_vth" represents the deviation of the threshold voltage of the transistor M1_pre. "ΔM1_pre_L" represents the deviation of the channel length of the transistor M1_pre. "ΔM2_pre_vth" represents the deviation of the threshold voltage of the transistor M2_pre. "ΔM2_pre_L" represents the deviation of the channel length of the transistor M2_pre. When f_pre( ) is a linear model, Eq. (8) can be represented as Eq. (9) below.

$$\Delta delay\_pre = a1 * \Delta M1\_pre\_vth + a2 * \Delta M1\_pre\_L + a3 * \Delta M2\_pre\_vth + a4 * \Delta M2\_pre\_L + \ldots \quad (9)$$

In the above, "a1" to "a4" are coefficients acquired by executing the fitting using the simulation data of the pre-layout circuit 401.

FIGS. 5A and 5B are explanatory diagrams of an example of the sampling data of the post-layout circuit. A sampling data group 501 of the post-layout circuit depicted in FIG. 5A includes the deviations of the deviation parameters of the post-layout circuit and the deviation of the performance value of the post-layout circuit. Sampling data includes n values of the deviation parameters of the post-layout circuit and one performance value.

All of the deviation parameters and the performance value appearing in the description with reference to FIGS. 5A and 5B are the deviation parameters and the performance value of the post-layout circuit. In the description with reference to each of FIGS. 5A and 5B, for simplification of the description, the "deviation parameter of the post-layout circuit" will simply be referred to as "deviation parameter" and the "performance value of the post-layout circuit" will simply be referred to as "performance value".

The sampling data of the post-layout circuit stores the deviations of the deviation parameters and the deviation of the performance value as one record. The sampling data group 501 of the post-layout circuit depicted in FIG. 5A includes records corresponding to records 501-1 to 501-cnt. For example, the record 501-1 stores a first deviation of the performance value, a first deviation of a deviation parameter 1, a first deviation of a deviation parameter 2, . . . , and a first deviation of a deviation parameter n.

FIG. 5B depicts a specific example of the sampling data of a post-layout circuit 510. It is assumed that a sampling data group 502 of the post-layout circuit 510 depicted in FIG. 5B includes records corresponding to records 502-1, 502-2, . . . , and 502-cnt. The post-layout circuit 510 depicted in FIG. 5B includes the transistor M1_post, a transistor M2_post, a resistor R1_post, and the capacitor C1_post. For the deviation parameters of the post-layout circuit 510, the deviation parameters of the transistors include "vth" representing the threshold voltage of each of the transistors and "L" representing the channel length of each. In FIG. 5B, it is assumed that the performance value is the delay amount.

In the above preconditions, the sampling data group 502 of the post-layout circuit 510 has fields of Δdelay_post, ΔM1_post_vth to ΔM2_post_L, . . . , ΔR1_post, ΔC1_post, . . . . The Δdelay_post field stores the deviation of the delay amount. The ΔM1_post_vth field stores the deviation of the threshold voltage of the transistor M1_post. The ΔM1_post_L field stores the deviation of the channel length of the transistor M1_post. The ΔM2_post_vht field stores the deviation of the threshold voltage of the transistor M2_post. The ΔM2_post_L field stores the deviation of the channel length of the transistor M2_post. The ΔR1_post field stores the deviation of the resistance value of the resistor R1. The ΔC1_post field stores the deviation of the capacitance of the capacitor C1.

For example, the record 502-1 stores Δd_post_1, ΔM1_post_vth_1, ΔM1_post_L_1, ΔM2_post_vth_1, and ΔM2_post_L_1 as a first sampling data. The record 502-1 also stores ΔR1 post_1 and ΔC1_post_1.

An operation procedure for a sparse data process will be described with reference to FIGS. 6 to 12. The sparse data process is a process of generating a deviation model of the post-layout circuit using a method with which it is estimated that the sparsity property of the differential model is enhanced. The sparse data process will be described with reference to FIGS. 6 to 12 using the deviation model of the pre-layout circuit 401 and the sampling data of the post-layout circuit 510. The basis of the estimation that the sparsity property is enhanced will be described later with reference to FIG. 11.

An example of correlation of arguments of the model of the pre-layout circuit with the deviation parameters of the post-layout circuit, included in the sparse data process will be described with reference to FIG. 6. An example of the result of the correlation will be described with reference to FIG. 7. An example will be described with reference to FIGS. 8 and 9 where differential data of the performance is generated using the result of the correlation, a process that is included in the sparse data process. An example will be described with reference to FIGS. 10 and 11 where the differential model is generated using the differential data of the performance, a process that is included in the sparse data process. An example will be described with reference to FIG. 12 where a deviation model of the post-layout circuit is generated using the differential model, a process that is included in the sparse data process.

Figure 6:
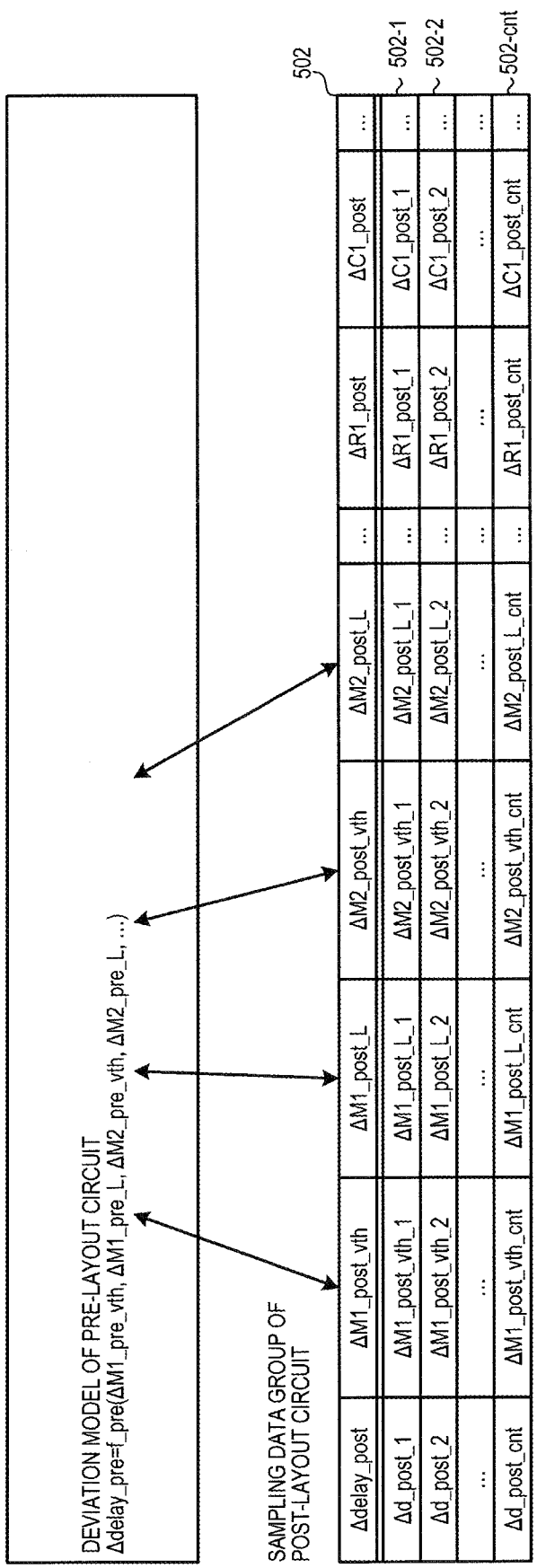
FIG. 6 is an explanatory diagram of an example of correlations of arguments of a model of the pre-layout circuit and deviation parameters of the post-layout circuit.

FIG. 6 is an explanatory diagram of an example of the correlation of the arguments of the model of the pre-layout circuit with the deviation parameters of the post-layout circuit. The circuit design support apparatus 100 executes a layout extraction tool and thereby, correlates the names of the arguments of the model of the pre-layout circuit with the names of data of the deviation parameters of the post-layout circuit.

Figure 7:
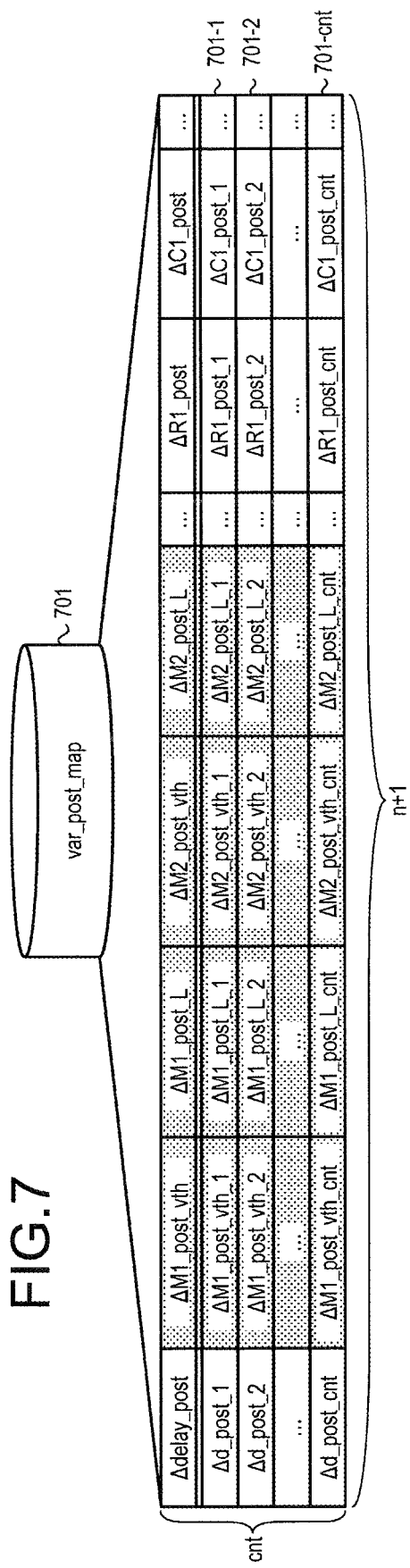
FIG. 7 is an explanatory diagram of an example of a result of correlation.

For example, in the example of FIG. 6, the circuit design support apparatus 100 correlates ΔM1_pre_vth and ΔM1_post_vth that commonly have "M1" and "vth" in their names; similarly, correlates ΔM1_pre_L and ΔM1_post_L that commonly have "M1" and "L" in their names; correlates ΔM2_pre_vth and ΔM2_post_vth that commonly have "M2" and "vth" in their names, with each other; and correlates ΔM2_pre_L and ΔM2_post_L that commonly have "M2" and "L" in their names. FIG. 7 depicts an example of the result of the correlation.

FIG. 7 is an explanatory diagram of the example of the result of the correlation. The circuit design support apparatus 100 retains the result of the correlation in the sampling data of the post-layout circuit 510 as var_post_map 701 that reflects the result of the correlation. The var_post_map 701 is a matrix vertically having cnt data and horizontally having n+1 data. The var_post_map 701 includes records 701-1 to 701-cnt.

FIG. 7 depicts the result of the correlation by hatching some of the cells of the var_post_map 701. For example, the correlated cells are the cells belonging to four fields of ΔM1_post_vth, ΔM1_post_L, ΔM2_post_vth, and ΔM2_post_L.

The apparatus generating the var_post_map 701 may be the circuit design support apparatus 100 or may be another apparatus. When the other apparatus generates the var_post_map 701, the circuit design support apparatus 100 acquires the generated var_post_map 701 from the other apparatus and generates the differential data described with reference to FIGS. 8 and 9.

Figure 8:
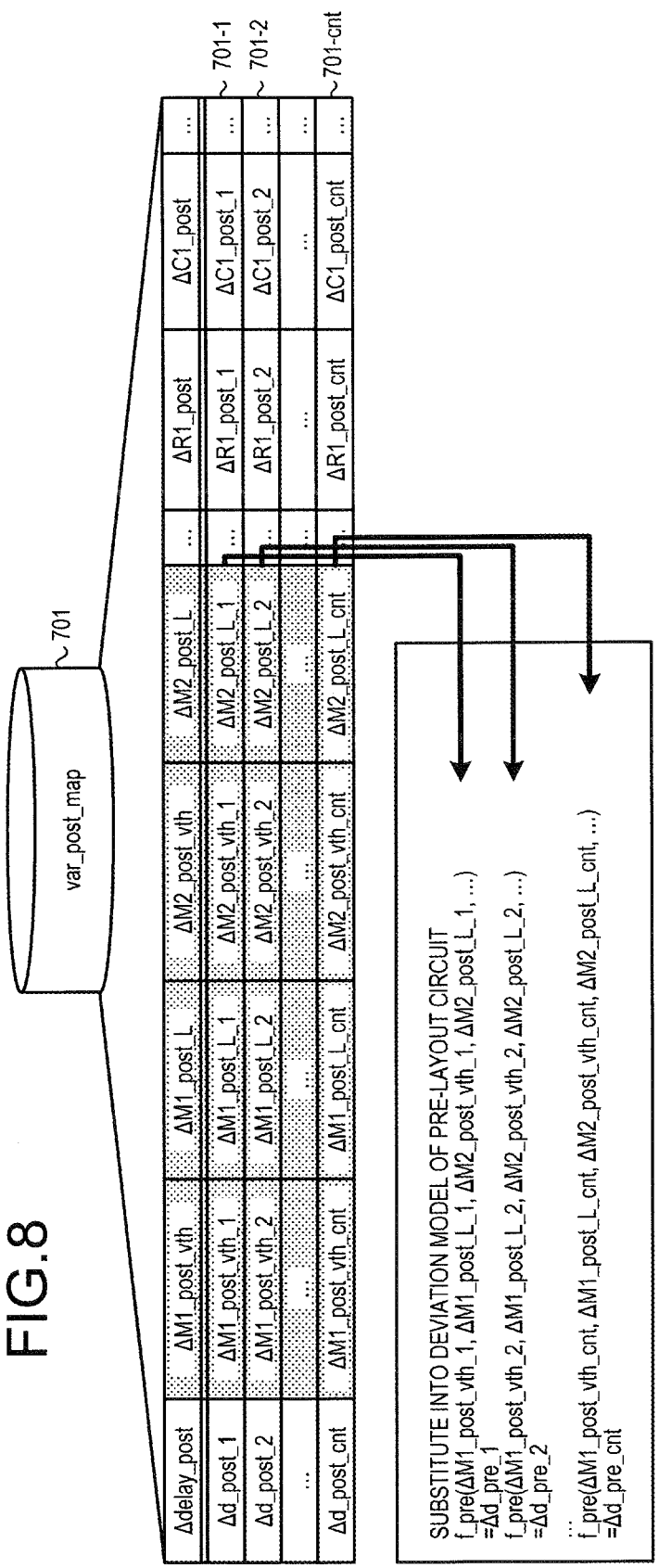
FIG. 8 is an explanatory diagram of an example of generation of differential data of performance.

FIG. 8 is an explanatory diagram of an example of generation of the differential data of the performance. The circuit design support apparatus 100 generates the differential data of the performance using the var_post_map 701, the deviation model of the pre-layout circuit 401, and the sampling data of the post-layout circuit 510.

The circuit design support apparatus 100 refers to the var_post_map 701 and substitutes therein the deviations of the correlated deviation parameters of the sampling data of the post-layout circuit 510 as the corresponding arguments of the deviation model of the pre-layout circuit 401. As the result of the substitution, the circuit design support apparatus 100 executes the deviation model of the pre-layout circuit 401 and generates the deviation of the delay amount.

In the example of FIG. 8, the circuit design support apparatus 100 substitutes values of the records 701-1 to 701-cnt as the arguments of the deviation model of the pre-layout circuit 401 and calculates the deviation of the delay amount acquired from the deviation model of the pre-layout circuit 401. For example, the circuit design support apparatus 100 substitutes ΔM1_post_vth_1 of the record 701-1 as a first argument of the deviation model of the pre-layout circuit 401 and also substitutes ΔM1_post_L_1 as a second argument of the deviation model of the pre-layout circuit 401. Similarly, the circuit design support apparatus 100 substitutes ΔM2_post_vth_1 as a third argument of the deviation model of the pre-layout circuit 401 and also substitutes ΔM2_post_L_1 as a fourth argument of the deviation model of the pre-layout circuit 401. As the result of the substitution of the first to the fourth arguments, the circuit design support apparatus 100 calculates the deviation Δd_pre_1 of the delay amount acquired as the result of the substitution of the data of the record 701-1 into the deviation model of the pre-layout circuit 401.

Similarly, the circuit design support apparatus 100 calculates the deviations Δd_pre_2, . . . , and Δd_pre_cnt of the delay amounts acquired as the result of the substitution of the data of the record 701-2, . . . , and those of the record 701-cnt into the deviation model of the pre-layout circuit 401. The processes executed thereafter will be described with reference to FIG. 9.

FIG. 9 is an explanatory diagram of the example of generation of the differential data of the performance. The circuit design support apparatus 100 calculates the difference between Δdelay_post representing the deviation of the delay amount of the post-layout circuit 510 and Δdelay_pre representing the deviation of the delay amount of the pre-layout circuit 401, as the differential data Δd.

For example, the circuit design support apparatus 100 calculates Δd_1 as the differential data from Δd_post_1–Δd_pre_1. Similarly, the circuit design support apparatus 100 calculates Δd_post_2–Δd_pre_2, calculates Δd_2 as the differential data, . . . , calculates Δd_post_cnt–Δd_pre_cnt, and calculates Δd_cnt. An example will be described with reference to FIGS. 10 and 11 where the differential model is generated using the differential data.

Figure 10:
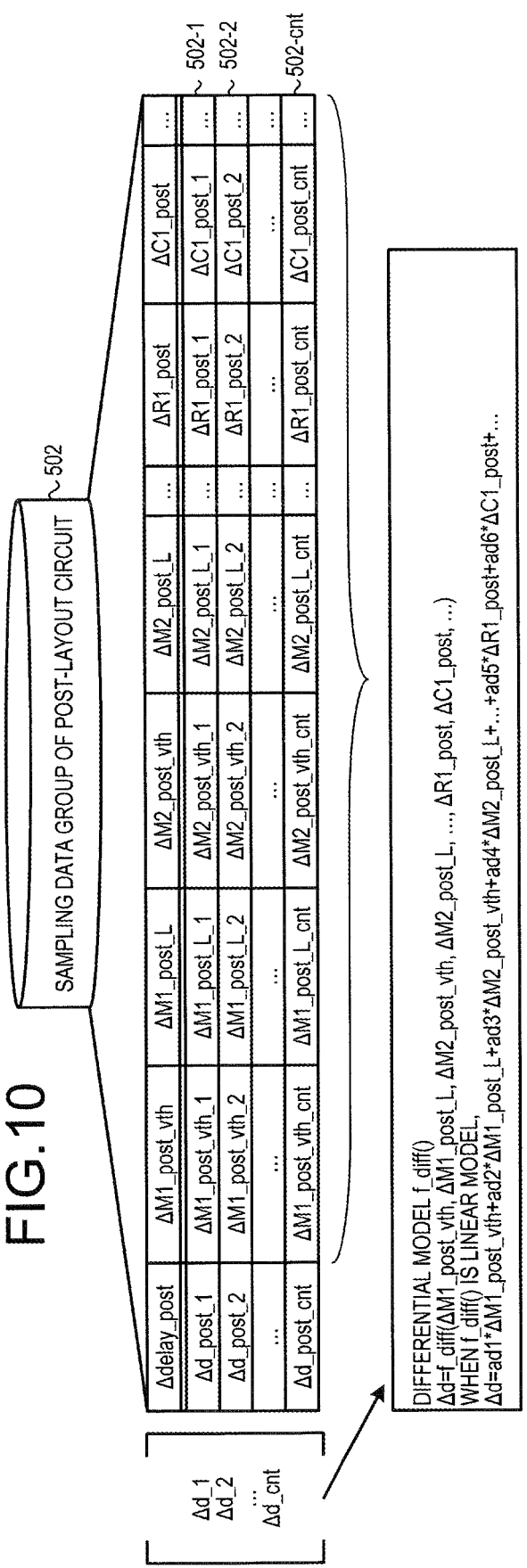
FIG. 10 is an explanatory diagram of an example of generation of a differential model.

FIG. 10 is an explanatory diagram of an example of generation of the differential model. The circuit design support apparatus 100 generates the differential model to acquire the differential data, based on the differential data and the deviations of the deviation parameters of the post-layout circuit 510.

For example, the circuit design support apparatus 100 executes the fitting using the differential data Δd_1 to Δd_cnt and ΔM1_post_vth_1 to ΔC1_post_cnt, . . . and thereby, generates the differential model f_diff( ). The differential model f_diff( ) is, for example, Eq. (10) below.

$$\Delta d = f\_\text{diff}(\Delta M1\_post\_vth, \Delta M1\_pre\_L, M2\_post\_vth, M2\_post\_L, \ldots, \Delta R1\_post, \Delta C1\_post, \ldots) \quad (10)$$

A specific example of the differential model f_diff( ) is, for example, Eq. (11) below.

$$\Delta d = ad1 * \Delta M1\_post\_vth + ad2 * \Delta M1\_post\_L + ad3 * \Delta M2\_post\_vth + ad4 * \Delta M2\_post\_L + \ldots + ad5 * \Delta R1\_post + ad6 * \Delta C1\_post + \ldots \quad (11)$$

Eq. (11) represents a case where the differential model f_diff( ) is a linear model. The differential model f_diff( ) may be a non-linear model. In Eqs. (10) and (11), "d" represents the delay amount of the post-layout circuit. "ad1", "ad2", . . . , "ad6", and . . . are coefficients acquired by executing the fitting using the differential data Δd_1 to Δd_cnt and the deviations ΔM1_post_vth_1 to ΔC1_post_cnt . . . of the deviation parameters of the post-layout circuit 510. An example will be described with reference to FIG. 11 where the differential model is generated using the LAR.

Figure 11:
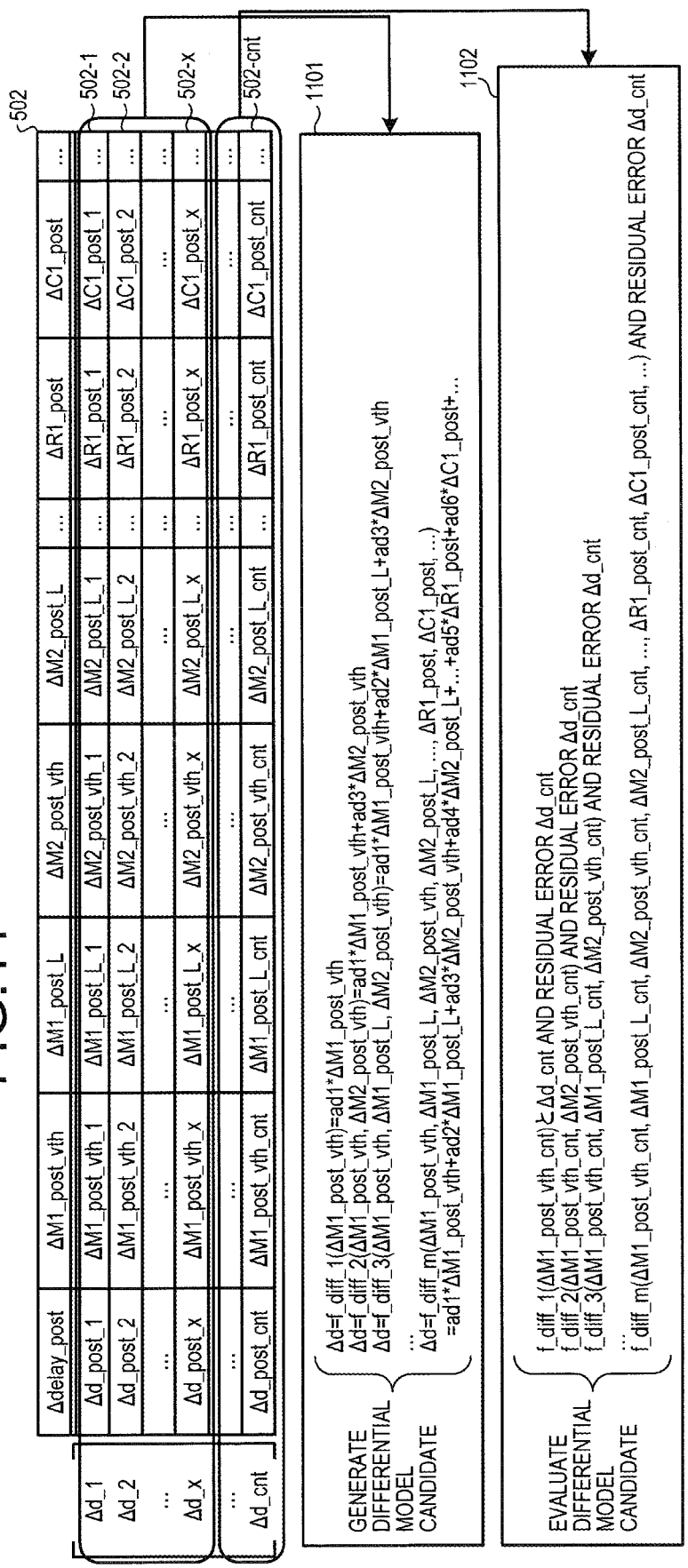
FIG. 11 is an explanatory diagram of the example of generation of the differential model.

FIG. 11 is an explanatory diagram of the example of generation of the differential model. A method of generating plural candidates for the differential model according to the LAR and selecting the candidate to be the differential model using the cross-validation, from the plural candidates for the differential model, will be described with reference to FIG. 11.

The circuit design support apparatus 100 divides the sampling data group 502 of the post-layout circuit 510 into the data to be used in the fitting and the data to be used in the evaluation. In the example depicted in FIG. 11, assuming that "x" is an integer smaller than cnt, the circuit design support apparatus 100 sets Δd_1 to Δd_x and the records 502-1 to 502-x to be the data to be used in the fitting and also sets the remaining data to be the data to be used in the evaluation.

The circuit design support apparatus 100 generates the plural candidates for the differential model using the data to be used in the fitting. As described in Xin Li's literature cited above, according to the LAR, highly correlated parameters are sequentially selected and the plural function models are generated.

For example, it is assumed that, according to Eq. (14) in the above Xin Li's literature, $f(\Delta Y)=-0.43*\Delta y1-1.66*\Delta y2+0.12*\Delta y3+0.28*\Delta y4-1.14*\Delta y5$ is acquired. It is assumed that $\alpha1=-0.43$, $\alpha2=-1.66$, $\alpha3=-0.12$, $\alpha4=-0.28$, and $\alpha5=1.14$. In this case, the apparatus executing the LAR selects $\alpha2, \alpha5, \alpha1, \alpha4$, and $\alpha3$ in descending order of absolute value of coefficient as the coefficients of the parameters affecting the difference and generates the plural function models.

By applying the LAR, the circuit design support apparatus 100 generates m candidates for the differential model depicted in a frame 1101. For example, the circuit design support apparatus 100 generates the m candidates for the differential model such as f_diff_1( ) having one deviation parameter that is $\Delta M1\_post\_vth$, f_diff_2( ) having two deviation parameters that are $\Delta M1\_post\_vth$ and $\Delta M2\_post\_vth$, . . . .

As depicted in a frame 1102, the circuit design support apparatus 100 evaluates the m candidates for the differential model and selects one candidate to be the differential model from the candidates for the differential model. For example, in FIG. 11, the m candidates for the differential model are evaluated using $\Delta d\_cnt$ and the record 502-cnt. For example, the circuit design support apparatus 100 acquires the residual error between f_diff_1($\Delta M1\_post\_vth\_cnt$) acquired by substituting $\Delta M1\_post\_vth\_cnt$ into f_diff_1( ) and $\Delta d\_cnt$, substitutes $\Delta d\_cnt$ and the values of the record 502-cnt in each of f_diff_2( ) to f_diff_m( ), and selects one candidate whose residual error has the smallest absolute value, as the differential model. The comparison for the selection does not need to be executed based on the absolute values of the residual errors and may be executed based on the squares of the residual errors.

The reason will be described why the sparsity property of the differential model f_diff( ) is better than the sparsity property of the deviation model f_post( ) of the post-layout circuit. The process of analyzing the deviation of the post-layout circuit is executed after the LVS is satisfied and therefore, the performance of the post-layout circuit and that of the pre-layout circuit are substantially equal. The number of parameters of the post-layout circuit is tremendous compared to that of the pre-layout circuit. However, the parameters affecting the performance of the post-layout circuit are highly likely to be few, among the parameters increased by the layout process.

Therefore, the number of parameters affecting the performance of the parameters of the differential model generated as depicted in FIG. 10 is highly likely to be fewer than the number of parameters affecting the performance of the parameters of the deviation model of the post-layout circuit. The decrease of the number of parameters affecting the performance improves the sparsity property of the differential model. Therefore, the circuit design support apparatus 100 can generate a highly accurate deviation analysis model even with few sampling data.

FIG. 12 is an explanatory diagram of an example of generation of the deviation model of the post-layout circuit. The circuit design support apparatus 100 generates the deviation model f_post( ) of the post-layout circuit 510 based on the deviation model f_pre( ) and the differential model f_diff( ) of the pre-layout circuit 401.

For example, the circuit design support apparatus 100 calculates f_post( ) using Eq. (12) below.

$$f\_post(\ )=f\_pre(\ )+f\_diff(\ ) \quad (12)$$

When the deviation model f_pre( ) and the differential model f_diff( ) of the pre-layout circuit 401 are linear models, the circuit design support apparatus 100 calculates f_post( ) using, for example, Eq. (13) below.

$$f\_post(\ )=(a1+ad1)*\Delta M1\_post\_vth+(a2+ad2)*\Delta M1\_post\_L+(a3+ad3)*\Delta M2\_post\_vth+(a4+ad4)*\Delta M2\_post\_L+\ldots+ad5*\Delta R1\_post+ad6*\Delta C1\_post+\ldots \quad (13)$$

A post-layout circuit generation process will be described with reference to FIGS. 13 and 14.

FIG. 13 is a flowchart of an example of a procedure for the post-layout circuit generation process. The post-layout circuit generation process is a process of generating the circuit information and the deviation model of the post-layout circuit 510. The circuit design support apparatus 100 acquires the circuit information of the pre-layout circuit 401 (step S1301), executes the layout process for the pre-layout circuit 401 (step S1302), and executes the sparse data process (step S1303). The details of the sparse data process will be described later with reference to FIG. 14. The circuit design support apparatus 100 outputs the circuit information and the deviation model of the post-layout circuit 510 (step S1304). After executing the operation at step S1304, the circuit design support apparatus 100 causes the post-layout circuit generation process to come to an end. The circuit design support apparatus 100 can generate the deviation model of the post-layout circuit 510 by executing the post-layout circuit generation process.

FIG. 14 is a flowchart of an example of a procedure for the sparse data process. The sparse data process is a process of generating the deviation model of the post-layout circuit using a method with which it is estimated that the sparsity property of the differential model is enhanced.

The circuit design support apparatus 100 correlates the arguments of the deviation model of the pre-layout circuit 401 with the deviation parameters of the post-layout circuit 510 (step S1401), calculates the performance value of the pre-layout circuit 401 using the result of the correlation, the deviation model of the pre-layout circuit 401, and the values of the deviation parameters of the post-layout circuit 510 (step S1402), and acquires the performance value of the post-layout circuit 510 that is obtained by simulation of the post-layout circuit 510 using the values of the deviation parameters of the post-layout circuit 510 (step S1403). The operation at step S1403 may concurrently be executed with the operation at step S1401 or S1402.

The circuit design support apparatus 100 calculates the difference of the calculated performance value of the pre-layout circuit 401 and the acquired performance value of the post-layout circuit 510 (step S1404), generates candidates of the differential model using the values of the deviation parameters of the post-layout circuit 510 and the calculated difference of the first combination (step S1405), selects one candidate to be the differential model from among the candidates of the differential model, using the values of the deviation parameters of the post layout circuit 510 and the calculated difference of the second combination (step S1406), and generates the deviation model of the post-layout circuit 510, based on the deviation model of the pre-layout circuit 401 and the differential model (step S1407).

After executing the operation at step S1407, the circuit design support apparatus 100 causes the sparse data process to come to an end. By executing the sparse data process, the circuit design support apparatus 100 can generate the deviation model of the post-layout circuit using the method by which it is estimated that the sparsity property of the differential model is enhanced.

The time period consumed for generating the deviation model of the post-layout circuit will be described for each of three methods used that include a response surface method, the method using the sparsity property, and the method according to this embodiment described with reference to FIGS. 13 and 14.

FIGS. 15A and 15B are explanatory diagrams of an example of a comparison among the time periods each consumed for the generation of the deviation model of the post-layout circuit. In FIGS. 15A and 15B, a case is taken as an example, where a deviation model of a voltage controlled oscillator (VCO) is generated, and the time periods that are consumed for the generation of the deviation model of the post-layout circuit of the VCO, based on the conditions described in a table 1501 are compared with each other. The table 1501 in FIG. 15A includes records 1501-1 and 1501-2. It is assumed that the time period that is consumed for the processing of the fitting executed when the deviation model is generated is negligible and that, when the deviation model is generated using the sparsity property, the circuit design support apparatus 100 prepares the sampling data such that (the number of parameters affecting the performance):(the number of sampling data)=1:3.

The record 1501-1 indicates that the number of elements of the pre-layout circuit of the VCO is 90; the number of parameters is 500; the time period consumed for executing one simulation for the pre-layout circuit of the VCO is five [min]; and the rate of the parameters not affecting the performance of the deviation parameters of the pre-layout circuit of the VCO is 80 [%]. Therefore, the rate of the parameters affecting the performance of the deviation parameters of the pre-layout circuit of the VCO is 100−80=20 [%].

The record 1501-2 indicates that the number of elements of the post-layout circuit of the VCO is 12,000; the number of parameters is 20,000; the time period consumed for executing one simulation for the post-layout circuit of the VCO is 1.5 [hours]; and the rate of the parameters not affecting the performance of the deviation parameters of the post-layout circuit of the VCO is 95 [%]. Therefore, the record 1501-2 also indicates that the rate of the parameters affecting the performance of the deviation parameters of the post-layout circuit of the VCO is 100−95=5 [%].

A table 1502 in FIG. 15B indicates the time periods consumed for generating the deviation model of the post-layout circuit of the VCO based on the conditions described in the table 1501 using each of the three methods of the RSM, the method of directly acquiring the deviation model of the post-layout circuit using the LAR, and the method according to this embodiment. The table 1502 includes records 1502-1 to 1502-3. The method of directly acquiring the deviation model of the post-layout circuit using LAR will simply be referred to as "LAR" in FIG. 15B for simplification of the description.

As indicated in the record 1502-1, the time period consumed for generating the deviation model of the post-layout circuit of the VCO using the RSM is 1,250 [days]. For example, the apparatus executing the RSM prepares 20,000 sampling data corresponding to the number of parameters of the post-layout circuit of the VCO and executes 20,000 simulations. Therefore, the time period consumed for the generation is 20,000*1.5=30,000 [hours]=1,250 [days].

As indicated in the record 1502-2, the time period consumed for generating the deviation model of the post-layout circuit of the VCO using the LAR is 187.5 [days]. For example, the apparatus executing the LAR prepares 20,000*0.05*3=3,000 sampling data derivable from the sparsity property of the post-layout circuit of the VCO and executes 3,000 simulations. Therefore, the time period consumed for the generation is 3,000*1.5=4,500 [hours]=187.5 [days].

As indicated in the record 1502-3, the time period consumed for generating the deviation model of the post-layout circuit of the VCO using the method according to this embodiment is about 38.5 [days]. A table 1503 in FIG. 15B indicates the breakdown of the time period consumed for the generation. The table 1503 includes records 1503-1 and 1503-2. The time period consumed for generating the deviation model of the post-layout circuit of the VCO using the method according to this embodiment is roughly divided into mainly two time periods as below. The first one is a time period indicated in the record 1503-1 and consumed for generating the deviation model of the pre-layout circuit of the VCO, and the second one is a time period indicated in the record 1503-2 and consumed for executing the simulations for the post-layout circuit used to generate the differential model.

As indicated in the record 1503-1, the time period consumed for generating the deviation model of the pre-layout circuit of the VCO is 25 [hours]. For example, the circuit design support apparatus 100 prepares 500*0.20*3=300 sampling data to generate the deviation model of the pre-layout circuit of the VCO and executes 300 simulations. Therefore, the time period necessary for the generation is 300*5=1,500 [mins]=25 [hours].

As indicated in the record 1503-2, the time period consumed for executing the simulations for the post-layout circuit used to generate the differential model is 900 [hours]. For example, the circuit design support apparatus 100 prepares 20,000*0.01*3=600 sampling data to prepare the sampling data of the post-layout circuit used to generate the differential model and executes 300 simulations. According to the record 1503-2, the rate of the parameters not affecting the performance of the parameter group of the differential model is 99 [%]. Therefore, the time period consumed for executing the simulations is 600*1.5=900 [hours].

According to the records 1503-1 and 1503-2, the time period consumed for generating the deviation model of the post-layout circuit of the VCO using the method according to this embodiment is 25+900=925 [hours]=about 38.5 [days]. As described, with the method according to the embodiment, the processing load for generating the deviation model can be reduced while maintaining the accuracy of the generation, compared to the RSM and the LAR.

As described, according to the circuit design support apparatus 100, the differential model is generated from the difference in the performance of the pre-layout and the post-layout circuits, and the values of the deviation parameters of the post-layout circuit. The number of deviation parameter affecting the difference of the differential model is smaller than the number of deviation parameters affecting the performance of the deviation model of the post-layout circuit. Therefore, the circuit design support apparatus 100 can generate a highly accurate differential model using a fewer number of sampling data than that used in the method of directly generating the deviation model of the post-layout circuit. The number of prepared sampling data is reduced and therefore, the circuit design support apparatus 100 can generate a highly accurate differential model at a high speed.

The circuit design support apparatus 100 may add to each other the performance value acquired by substituting the sampling data of the post-layout circuit into the deviation model of the pre-layout circuit and the performance value acquired by substituting data that is the same as the sampling data input as above into the differential model. The result of the addition is the performance value of the post-layout circuit.

According to the circuit design support apparatus 100, the deviation model of the pre-layout circuit may be generated from the differential model and the deviation model of the pre-layout circuit. Thereby, the circuit design support apparatus 100 is able to acquire the performance value of the post-layout circuit with a smaller processing amount than that for adding to each other the performance value acquired from the deviation model of the pre-layout circuit and the performance value acquired from the differential model. When the order of each of the parameters of the deviation model of the pre-layout circuit matches the order of each of the deviation parameters of the differential model, the circuit design support apparatus 100 adds in advance the coefficient and, when the performance value of the post-layout circuit is acquired, is able to reduce the processing by the processing for the addition.

According to the circuit design support apparatus 100, the generation method of the deviation model of the post-layout circuit according to this embodiment may be executed for the post-layout circuit after satisfying the DRC. The performance of the pre-layout circuit and that of the post-layout circuit become closer to each other by satisfying the DRC and therefore, the number of parameters affecting the difference of the performance is reduced, among the parameters of the differential model. Therefore, the circuit design support apparatus 100 can generate a highly accurate deviation model using a fewer number of sampling data. The same can be stated for the post-layout circuit after satisfying the LVS.

According to the circuit design support apparatus 100, the differential model may be generated by storing the plural combinations that each include the parameters of the post-layout deviation parameter group and by using the performance values of the pre-layout and the post-layout circuits corresponding to the combinations, and the values included in the combination. The accuracy of the differential model can be improved by generating the differential model using the plural sampling data.

According to the circuit design support apparatus 100, the candidates for the differential model may be generated using the first combination of the plural combinations; the candidates of the differential model may be evaluated using the second combination; and the candidate to be the differential model may be selected from the candidates for the differential model. Thus, the circuit design support apparatus 100 is able to suppress over-fitting during the generation of the differential model.

The circuit design support method described in the present embodiment may be implemented by executing a prepared program on a computer such as a personal computer and a workstation. The program is stored on a non-transitory, computer-readable recording medium such as a hard disk, a flexible disk, a CD-ROM, an MO, and a DVD, read out from the computer-readable medium, and executed by the computer. The program may be distributed through a network such as the Internet.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit design support method that is executed by a computer, the circuit design support method comprising:
    calculating, by using the computer, a first performance value of a circuit under design before a layout process, the first performance value being calculated by using a first parameter group that represents properties of elements of the circuit under design before the layout process, to refer to a storage unit that stores values of parameters of a second parameter group that represent properties of the elements of the circuit under design after the layout process, and inputting into a first function model that represents a performance value of the circuit under design before the layout process, the values of the parameters that are among the parameters of the second parameter group and correspond to parameters of a first parameter group;
    acquiring a second performance value of the circuit under design after the layout process, the second performance value being obtained by simulating operation of the circuit under design after the layout process, using the values of the parameters of the second parameter group stored in the storage unit; and
    generating a second function model that represents a difference in the performance value of the circuit under design before and after the layout process, the second function model being generated based on the calculated first performance value, the acquired second performance value, and the values of the parameters of the second parameter group stored in the storage unit and by using the second parameter group.

2. The circuit design support method according to claim 1, further comprising:
    generating a third function model that represents a performance value of the circuit under design after the layout process, the third function model being generated based on the generated second and first function models and by using the second parameter group.

3. The circuit design support method according to claim 1, wherein
    the circuit under design after the layout process is a circuit that satisfies design rules of a process.

4. The circuit design support method according to claim 1, wherein
    the circuit under design after the layout process is a circuit whose elements corresponding to the elements of the circuit under design before the layout process have connection relations that match connection relations of the elements of the circuit under design before the layout process.

5. The circuit design support method according to claim 1, wherein
    the storage unit stores plural combinations respectively including the values of the parameters of the second parameter group,
    the calculating includes calculating the first performance value of the circuit under design before the layout process, for a combination by inputting into the first function model, the values of the parameters that are among the parameters of the second parameter group, are included in the combination, and correspond to the parameters of the first parameter group, the acquiring includes acquiring the second performance value for the combination, by simulating operation of the circuit under design after the layout process, using the values of the parameters that are among the second parameter group and included in the combination stored in the storage unit, and the generating includes generating the second function model, based on the first performance value calculated for the combination, the second performance value acquired for the combination, and the values of the parameters that are in the second parameter group and included in the combination.

6. The circuit design support method according to claim 5, further comprising generating candidates of the second function model, each corresponding to a combination of a portion of the parameters selected from the second parameter group, the candidates being generated using the portion of the parameters and based on the first performance value that corresponds to a first combination that is among the combinations stored in the storage unit, the second performance value that corresponds to the first combination, and the values of the parameters that are among the second parameter group and included in the first combination, and the generating of the second function model, includes selecting from among the generated candidates of the second function model, a candidate that is to be the second function model, based on a first performance value corresponding to a second combination that is different from the first combination among the combinations, a second performance value corresponding to the second combination, and the values of the parameters that are among the second parameter group and included in the second combination.

7. A circuit design support apparatus comprising
a processor that is configured to:

calculate a first performance value of a circuit under design before a layout process, the first performance value being calculated by using a first parameter group that represents properties of elements of the circuit under design before the layout process, to refer to a storage unit that stores values of parameters of a second parameter group that represent properties of the elements of the circuit under design after the layout process, and input into a first function model that represents a performance value of the circuit under design before the layout process, the values of the parameters that are among the parameters of the second parameter group and correspond to parameters of a first parameter group;

acquire a second performance value of the circuit under design after the layout process, the second performance value being obtained by simulating operation of the circuit under design after the layout process, using the values of the parameters of the second parameter group stored in the storage unit; and generate a second function model that represents a difference in the performance value of the circuit under design before and after the layout process, the second function model being generated based on the calculated first performance value, the acquired second performance value, and the values of the parameters of the second parameter group stored in the storage unit and by using the second parameter group.

8. A non-transitory, computer-readable recording medium that stores a circuit design support program that causes a computer to execute a process comprising:

calculating a first performance value of a circuit under design before a layout process, the first performance value being calculated by using a first parameter group that represents properties of elements of the circuit under design before the layout process, to refer to a storage unit that stores values of parameters of a second parameter group that represent properties of the elements of the circuit under design after the layout process, and inputting into a first function model that represents a performance value of the circuit under design before the layout process, the values of the parameters that are among the parameters of the second parameter group and correspond to parameters of a first parameter group;

acquiring a second performance value of the circuit under design after the layout process, the second performance value being obtained by simulating operation of the circuit under design after the layout process, using the values of the parameters of the second parameter group stored in the storage unit; and generating a second function model that represents a difference in the performance value of the circuit under design before and after the layout process, the second function model being generated based on the calculated first performance value, the acquired second performance value, and the values of the parameters of the second parameter group stored in the storage unit and by using the second parameter group.

* * * * *

UNITED STATES PATENT AND TRADEMARK OFFICE
CERTIFICATE OF CORRECTION

PATENT NO. : 8,788,992 B2  
APPLICATION NO. : 14/066240  
DATED : July 22, 2014  
INVENTOR(S) : Yu Liu Page 1 of 1

It is certified that error appears in the above-identified patent and that said Letters Patent is hereby corrected as shown below:

Title Page, Foreign Application Priority Data should be inserted as shown below:

Item -- (30)    Foreign Application Priority Data

Dec. 18, 2012    (JP)...........................2012-276296 --

Signed and Sealed this  
Twenty-first Day of October, 2014

Michelle K. Lee  
*Deputy Director of the United States Patent and Trademark Office*